United States Patent
Haas et al.

(10) Patent No.: US 8,753,986 B2
(45) Date of Patent: Jun. 17, 2014

(54) LOW K PRECURSORS PROVIDING SUPERIOR INTEGRATION ATTRIBUTES

(75) Inventors: Mary Kathryn Haas, Emmaus, PA (US); Raymond Nicholas Vrtis, Orefield, PA (US); Laura M. Matz, Allentown, PA (US)

(73) Assignee: Air Products and Chemicals, Inc., Allentown, PA (US)

( * ) Notice: Subject to any disclaimer, the term of this patent is extended or adjusted under 35 U.S.C. 154(b) by 99 days.

(21) Appl. No.: 12/969,042

(22) Filed: Dec. 15, 2010

(65) Prior Publication Data

US 2011/0308937 A1    Dec. 22, 2011

Related U.S. Application Data

(60) Provisional application No. 61/289,490, filed on Dec. 23, 2009, provisional application No. 61/366,671, filed on Jul. 22, 2010.

(51) Int. Cl.
*H01L 21/31* (2006.01)

(52) U.S. Cl.
USPC ........... 438/780; 438/781; 438/788; 438/789; 438/795

(58) Field of Classification Search
USPC ........ 438/780, 781, 788, 789, 795; 427/248.1
See application file for complete search history.

(56) References Cited

U.S. PATENT DOCUMENTS

| | | | |
|---|---|---|---|
| 6,312,793 B1 | 11/2001 | Grill et al. | |
| 6,583,048 B1 | 6/2003 | Vincent et al. | |
| 6,846,515 B2 | 1/2005 | Vrtis et al. | |
| 7,098,149 B2 * | 8/2006 | Lukas et al. | 438/778 |
| 7,112,615 B2 * | 9/2006 | Gleason et al. | 521/77 |
| 7,332,445 B2 * | 2/2008 | Lukas et al. | 438/780 |
| 2002/0123240 A1 | 9/2002 | Gallagher et al. | |
| 2003/0198742 A1 | 10/2003 | Vrtis et al. | |
| 2004/0063336 A1 | 4/2004 | Hendricks | |
| 2004/0175957 A1 * | 9/2004 | Lukas et al. | 438/778 |
| 2005/0161060 A1 | 7/2005 | Johnson et al. | |
| 2005/0227502 A1 | 10/2005 | Schmitt et al. | |
| 2006/0078676 A1 | 4/2006 | Lukas et al. | |
| 2006/0160374 A1 | 7/2006 | Ho et al. | |
| 2006/0180922 A1 * | 8/2006 | Cotte et al. | 257/702 |
| 2007/0141829 A1 | 6/2007 | Ramappa et al. | |
| 2008/0107573 A1 * | 5/2008 | Schmitt et al. | 422/198 |
| 2008/0271640 A1 | 11/2008 | Vrtis et al. | |

(Continued)

FOREIGN PATENT DOCUMENTS

| | | |
|---|---|---|
| CN | 1782124 A | 6/2006 |
| EP | 0794569 | 9/1997 |

(Continued)

OTHER PUBLICATIONS

Silverstein, M.S., et al; PolyHIPE: IPNs, Hybrids, Nanoscale Porosity, Silica Monoliths and ICP-Based Sensors; Science Direct; Polymer 46; pp. 6682-6694; 2005.

*Primary Examiner* — Hsien Ming Lee
(74) *Attorney, Agent, or Firm* — Rosaleen P. Morris-Oskanian

(57) ABSTRACT

A deposition for producing a porous organosilica glass film comprising: introducing into a vacuum chamber gaseous reagents including one precursor of an organosilane or an organosiloxane, and a porogen distinct from the precursor, wherein the porogen is aromatic in nature; applying energy to the gaseous reagents in the chamber to induce reaction of the gaseous reagents to deposit a film, containing the porogen; and removing substantially all of the organic material by UV radiation to provide the porous film with pores and a dielectric constant less than 2.6.

21 Claims, 6 Drawing Sheets

(56) References Cited

U.S. PATENT DOCUMENTS

| | | |
|---|---|---|
| 2009/0136667 A1 | 5/2009 | Deval et al. |
| 2009/0263972 A1* | 10/2009 | Balseanu et al. ............. 438/696 |
| 2010/0092759 A1* | 4/2010 | Fan et al. ...................... 428/323 |
| 2010/0248443 A1* | 9/2010 | Lee et al. ...................... 438/422 |

FOREIGN PATENT DOCUMENTS

| | | |
|---|---|---|
| EP | 1 655 355 A2 | 5/2006 |
| EP | 1 666 632 A2 | 6/2006 |
| FR | 2899379 | 6/2008 |
| FR | 2095517 | 4/2009 |
| JP | 2005-210130 | 8/2005 |
| JP | 2006-10083 | 4/2006 |
| JP | 2006-100833 A | 4/2006 |
| TW | 200307761 A | 12/2003 |
| WO | 2004/038783 A2 | 5/2004 |
| WO | 2008015533 | 2/2008 |

\* cited by examiner

LOW K PRECURSORS PROVIDING SUPERIOR INTEGRATION ATTRIBUTES

CROSS REFERENCE TO RELATED APPLICATIONS

The present patent application claims the benefit of U.S. Provisional Patent Application Ser. Nos. 61/289,490 filed Dec. 23, 2009 and 61/366,671 filed Jul. 22, 2010.

BACKGROUND OF THE INVENTION

The present invention is directed to the field of low dielectric constant materials produced by chemical vapor deposition (CVD) methods. In particular, the present invention is directed to methods for making films of such materials and their use as insulating layers in electronic devices.

As integrated circuit dimensions shrink, the property requirements for porous dielectric or interlayer dielectric (ILD) materials become more rigorous. In particular, any structural damage incurred during the patterning process can cause critical dimension shift in ILD features. Therefore a need exists to provide porous ILD materials that can withstand patterning with reduced or limited damage. It has been shown previously that increasing the total carbon content in the low k film can provide better damage resistance and retention of key properties. One of the means to do this is to increase methyl or methylene content in the film, however these methods can have an unfavorable impact on mechanical properties. Providing a method for increasing the total carbon content of the ILD film while retaining sufficient mechanical properties is enabling for the manufacture of next generation integrated circuits.

A process of making a silicon-containing porous film is known in which a broad variety of porogen precursors are claimed, including a family of partially or fully unsaturated organic molecules which includes aromatic species.

It is known that aromatic precursors, such as: toluene and xylene, can be used to make amorphous carbon insulating or hardmask films. In these applications, the films are thermally stable up to 400° C. and higher. For example, the prior art describes the use of amorphous carbon or fluorinated carbon films with dielectric constants of 2.3-2.4. The prior art discloses carbonaceous films from a variety of partially or fully unsaturated precursors. In both inventions, the precursors are used independently from an organosilicon backbone; and unlike the present invention, the organic material is not liberated to form a porous film. In addition, amorphous carbon films are known to provide poor mechanical properties rendering them unsuitable for an interlayer dielectric material.

The prior art describes the use of 1,3,5 trimethylbenzene as a porogen precursor for porous organosilicate films. The prior art relies on the use of thermal post-treatment to liberate the organic material.

The role or benefit of these aromatic reactive substances compared to other reactive substances is not specified.

The prior art also identifies the use of various porogen precursors, including cymene and carene in combination with silicon-containing precursors and an oxidant are described. The oxidative species, such as $N_2O$, are used in 10× excess of the silicon-containing precursor, in order to promote oxidation. In addition, the invention relies of the use of thermal post-treatment to liberate the organic material.

Finally, the prior art also describes a method for producing a three phase dielectric film where the first phase is an organosilicate backbone, the second phase is comprised of $CH_x$, and the third phase is comprised of air-filled pores. The result is a carbon-rich film which can provide dielectric constants of k=2.8 and above. The prior art details the results of fourier transform infrared spectroscopy (FT-IR) peak integration, which show that the $CH_x$ hydrocarbon content of the invention is up to 20× greater compared to films generated without the use of an organic precursor. In contrast, the present invention demonstrates dielectric constants below k=2.6 and a non-hydrogen containing carbon rich phase as evidenced by FT-IR analysis. The result is a superior combination of electrical, mechanical, and integration properties compared to prior art.

Prior art U.S. Pat. No. 6,312,793; U.S. Pat. No. 6,583,048; U.S. Pat. No. 6,846,515; U.S. Pat. No. 7,098,149; US 2004/0063336; US 2005/0227502; US 2006/0160374; US 2007/0141829; EP794569 and WO2008/015533 are also considered relevant.

In contrast to the above prior art, a key aspect of the present invention, described below, is to deposit a porogen-derived species in combination with a silicon-containing species, where greater than 50% of the porogen derived species can be readily liberated by ultra-violet radiation to form a porosity. A film with superior integration attributes such as a high total carbon content is achieved by using aromatic porogen precursors with silicon-containing precursors in combination. Preferably, the final film also has sufficient or improved mechanical properties that prevent failure during packaging.

BRIEF SUMMARY OF THE INVENTION

The present invention in one embodiment is a chemical vapor deposition method for producing a porous organosilica glass film, said method comprising:

providing a substrate within a vacuum chamber;

introducing into the vacuum chamber, gaseous reagents including at least one precursor selected from the group consisting of one or more silicon-containing precursors; and a porogen precursor, that is distinct from the precursor;

wherein the porogen precursor is aromatic in nature, and represented by the formula:

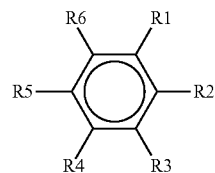

where R1-R6 are independently selected from the group consisting of: H, OH, $C_1$ to $C_6$ linear hydrocarbon, $C_3$ to $C_6$ branched, saturated, singly or multiply unsaturated hydrocarbon, $C_4$ to $C_6$ cyclic hydrocarbon, $C_1$ to $C_6$ alcohol, $C_4$ to $C_6$ branched, saturated or multiple unsaturated, cyclic ether, $C_2$ to $C_6$ epoxide or ketone;

wherein the one or more silicon containing precursors are selected from the formulas:

(i) $R^1{}_n(OR^2)_p(O(O)CR^4)_{3-n-p}Si\text{—}R^7\text{—}SiR^3{}_m(O(O)CR^6)_q(OR^6)_{3-m-q}$ where $R^1$ and $R^3$ are independently selected from the group consisting of H or $C_1$ to $C_4$ linear hydrocarbon, $C_3$ to $C_4$ branched, saturated, $C_2$ to $C_4$ singly unsaturated hydrocarbon, $C_3$ to $C_4$ multiply unsaturated hydrocarbon, $C_4$ cyclic hydrocarbon, $C_1$ to $C_4$ partially or fully fluorinated hydrocarbon; $R^2$, $R^6$ and $R^7$ are independently selected from the group consisting of $C_1$ to $C_6$ linear hydrocarbon, $C_3$ to $C_6$ branched, saturated or multiply unsaturated hydrocarbon, $C_2$ to $C_6$ singularly unsaturated hydrocarbon, $C_4$ to $C_6$ cyclic or, aromatic hydrocarbon, $C_1$ to $C_6$ partially or fully fluorinated hydrocarbon; $R^4$ and $R^5$ are independently selected from the group consisting of: H, $C_1$ to $C_6$ linear hydrocarbon, $C_3$ to $C_6$ branched, saturated or multiply unsaturated hydrocarbon, $C_2$ to $C_6$ singularly unsaturated hydrocarbon, $C_4$ to $C_6$ cyclic or, aromatic hydrocarbon, $C_1$ to $C_6$ partially or fully fluorinated hydrocarbon; n is 0 to 3; m is 0 to 3; q is 0 to 3 and p is 0 to 3; provided that n+m≥1, n+p≤3, and m+q≤3;

(ii) $R^1{}_n(OR^2)_p(O(O)CR^3)_{4-(n+p)}Si$ where $R^1$ is independently selected from the group consisting of: H or $C_1$ to $C_4$ linear hydrocarbon, $C_3$ to $C_4$ branched, saturated, or multiply unsaturated, $C_2$ to $C_4$ singularly unsaturated hydrocarbon, $C_4$ cyclic hydrocarbon, $C_1$ to $C_4$ partially or fully fluorinated hydrocarbon; $R^2$ is independently selected from the group consisting of $C_1$ to $C_6$ linear hydrocarbon, $C_3$ to $C_6$ branched, saturated, singly or multiply unsaturated hydrocarbon, $C_2$ to $C_6$ singularly unsaturated hydrocarbon, $C_4$ to $C_6$ cyclic or aromatic hydrocarbon, $C_1$ to $C_6$ partially or fully fluorinated hydrocarbon, $R^3$ is independently selected from the group consisting of H, $C_1$ to $C_6$ linear hydrocarbon, $C_3$ to $C_6$ branched, saturated, or multiply unsaturated, $C_2$ to $C_4$ singularly unsaturated hydrocarbon, $C_4$ to $C_6$ cyclic or aromatic hydrocarbon, $C_1$ to $C_6$ partially or fully fluorinated hydrocarbon; n is 1 to 3; and, p is 0 to 3;

(iii) Methyltriethoxysilane; and, (iv) Methyltrimethoxysilane;

applying energy to the gaseous reagents in the vacuum chamber to induce reaction of the gaseous reagents to deposit a preliminary film on the substrate, wherein the preliminary film contains the porogen; and using UV radiation to remove from the preliminary film a portion of the organic material to provide the porous organosilica glass film having a dielectric constant less than 2.6.

In one embodiment, an oxidizing gas may be added to the deposition process. Examples of oxidizing gases include but are not limited to oxygen, $N_2O$, ozone, $H_2O_2$, and mixtures thereof. In another embodiment, the deposition process is conducted without an oxidizing gas.

In a further embodiment, there is provided a composition comprising: (a) at least one silicon containing precursor selected from the group consisting of:

(a) at least one silicon containing precursor selected from the group consisting of:

(i) $R^1{}_n(OR^2)_p(O(O)CR^4)_{3-n-p}S^1-R^7-SiR^3{}_m(O(O)CR^5)_q(OR^6)_{3-m-q}$ where $R^1$ and $R^3$ are independently selected from the group consisting of H or $C_1$ to $C_4$ linear hydrocarbon, $C_3$ to $C_4$ branched, saturated, $C_2$ to $C_4$ singly unsaturated hydrocarbon, $C_3$ to $C_4$ multiply unsaturated hydrocarbon, $C_4$ cyclic hydrocarbon, $C_1$ to $C_4$ partially or fully fluorinated hydrocarbon; $R^2$, $R^6$ and $R^7$ are independently selected from the group consisting of $C_1$ to $C_6$ linear hydrocarbon, $C_3$ to $C_6$ branched, saturated or multiply unsaturated hydrocarbon, $C_2$ to $C_6$ singularly unsaturated hydrocarbon, $C_4$ to $C_6$ cyclic or, aromatic hydrocarbon, $C_1$ to $C_6$ partially or fully fluorinated hydrocarbon; $R^4$ and $R^5$ are independently selected from the group consisting of: H, $C_1$ to $C_6$ linear hydrocarbon, $C_3$ to $C_6$ branched, saturated or multiply unsaturated hydrocarbon, $C_2$ to $C_6$ singularly unsaturated hydrocarbon, $C_4$ to $C_6$ cyclic or, aromatic hydrocarbon, $C_1$ to $C_6$ partially or fully fluorinated hydrocarbon; n is 0 to 3; m is 0 to 3; q is 0 to 3 and p is 0 to 3; provided that n+m≥1, n+p≤3, and m+q≤3;

(ii) $R^1{}_n(OR^2)_p(O(O)CR^3)_{4-(n+p)}Si$ where $R^1$ is independently selected from the group consisting of: H or $C_1$ to $C_4$ linear hydrocarbon, $C_3$ to $C_4$ branched, saturated, or multiply unsaturated, $C_2$ to $C_4$ singularly unsaturated hydrocarbon, $C_4$ cyclic hydrocarbon, $C_1$ to $C_4$ partially or fully fluorinated hydrocarbon; $R^2$ is independently selected from the group consisting of $C_1$ to $C_6$ linear hydrocarbon, $C_3$ to $C_6$ branched, saturated, singly or multiply unsaturated hydrocarbon, $C_2$ to $C_6$ singularly unsaturated hydrocarbon, $C_4$ to $C_6$ cyclic or aromatic hydrocarbon, $C_1$ to $C_6$ partially or fully fluorinated hydrocarbon, $R^3$ is independently selected from the group consisting of H, $C_1$ to $C_6$ linear hydrocarbon, $C_3$ to $C_6$ branched, saturated, or multiply unsaturated, $C_2$ to $C_4$ singularly unsaturated hydrocarbon, $C_4$ to $C_6$ cyclic or aromatic hydrocarbon, $C_1$ to $C_6$ partially or fully fluorinated hydrocarbon; n is 1 to 3; and, p is 0 to 3;

(iii) Methyltriethoxysilane; and, (iv) Methyltrimethoxysilane; and (b) A porogen precursor comprising a compound represented by the following formula:

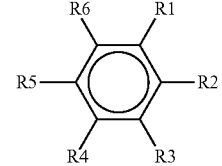

where R1-R6 are groups that can be independently H; or OH; or $C_1$ to $C_6$ linear hydrocarbon, or $C_3$ to $C_6$ branched, saturated, or multiply unsaturated hydrocarbon, $C_2$ to $C_6$ singularly unsaturated hydrocarbon, $C_4$ to $C_6$ cyclic hydrocarbon; or $C_1$ to $C_6$ linear alcohol, $C_3$ to $C_6$ branched, saturated or multiple unsaturated, alcohol or cyclic ether, and $C_2$ to $C_6$ epoxide or ketone.

In yet another embodiment, the silicon precursors tetraethoxyilane, triethoxysilane, trimethoxysilane, or diethoxysilane may be added to the mixture as a film hardening additive.

In a still further embodiment, the composition is provided in a kit, wherein the porogen and the at least one silicon containing precursor are maintained and delivered to the deposition chamber from separate vessels. In this or other embodiments, at least one of the vessels is a pressurizable stainless steel vessel, and the precursors are subsequently mixed in the deposition system to form the final film.

In an additional embodiment, the porogen precursor and the at least one silicon containing precursor are maintained in a single vessel having a separation means for maintaining the porogen and the at least one silicon containing precursor separate.

In a still further embodiment, the porogen precursor and the at least one silicon containing precursor are premixed in a single vessel. In another embodiment, the one or more silicon precursors are premixed in a single vessel, and the porogen precursor is maintained in a separate vessel. In this or other embodiments, at least one of the vessels is a pressurizable stainless steel vessel, and the precursors are mixed in the deposition system to form the final film.

DETAILED DESCRIPTION OF THE INVENTION

Figure 1:
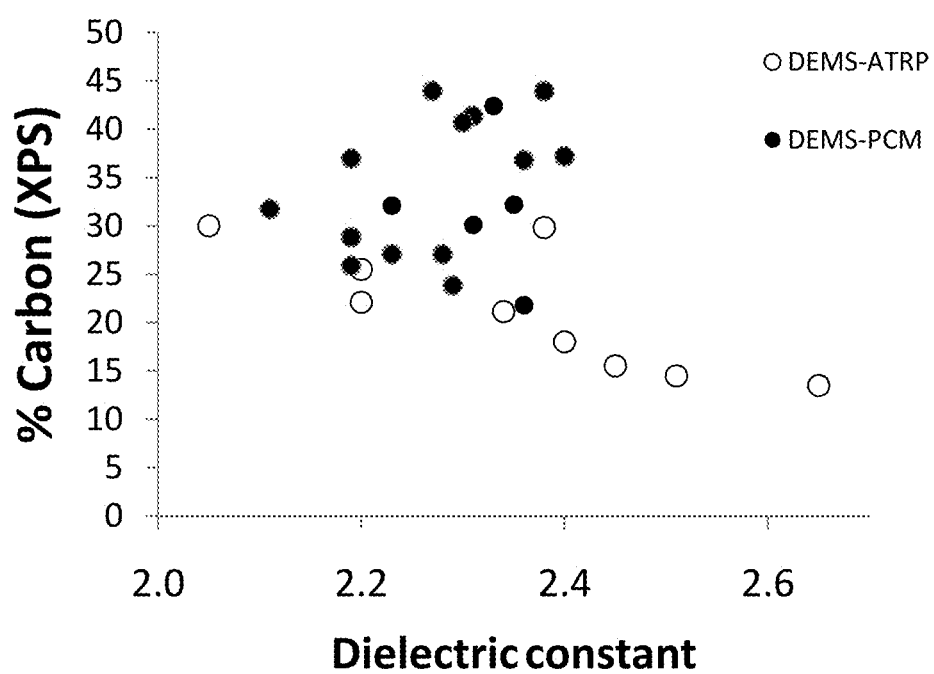
FIG. 1. X-ray photoelectron Spectroscopy (XPS) carbon content of porous dielectric films as a function of dielectric constant for a variety of plasma enhanced chemical vapor deposition (PECVD) deposition conditions. Diethoxymethylsilane-p-cymene (DEMS-PCM) films have the ability to introduce a broader range of total carbon content for a given dielectric constant compared to the industry standard Diethoxymethylsilane-alpha-terpinene (DEMS-ATRP).

Organosilicates are candidates for low k materials, but without the addition of porogens to add porosity to these materials, their inherent dielectric constant is limited to as low at 2.7. The addition of porosity, where the void space has an inherent dielectric constant of 1, reduces the overall dielectric constant of the film.

It is known that porous glass films can be produced using co-deposition of a silicon structure former and an organic porogen precursor, and subsequent liberation of the porogen precursor to produce porosity. One of the challenges of using these films, especially at small dimensions is having sufficient mechanical properties to withstand packaging, and having sufficient etch resistance to survive patterning. For example, films with low total carbon content have been shown to contribute to pattern collapse due to sidewall damage. In many cases, etch resistance and mechanical properties are competing properties; where for example increasing SiO network methyl content provides better etch resistance, but lowers mechanical properties.

Porous low k dielectric films are in use for 45 nanometer (nm) devices and beyond. Two of the commercially available processes are diethoxymethylsilane (DEMS)+alpha-terpinene (ATRP) and DEMS+bcyclo[2.2.1]hepta-2,5-diene (BCHD), also known as norbornadiene or 2,5-norbornadiene. As device dimensions continue to shrink, there remains a concern that etch and ash damage to the porous low k will become a limitation to integration. It is also known that introducing a higher total carbon content into the porous low k film can decrease the damage induced during integration. One known mechanism of film damage is the loss of carbon, which renders the film hydrophilic and more susceptible to chemical attack during subsequent integration steps. This can be mitigated either through limiting the depth of damage during ULK patterning, or by targeting a film that does not become hydrophilic during integration.

DEMS+BCHD has been developed as a means of introducing higher carbon content to the ULK film. However, the BCHD molecule is inherently unstable and self-polymerizes, and challenges remain in terms of handling and delivery. In addition, several reports indicate that DEMS-BCHD films may provide reduced mechanical properties compared to DEMS-ATRP films at the same dielectric constant.

The present invention provides porogen precursors that incorporate a high carbon content into the low k film while maintaining reasonable mechanical properties. This is accomplished through the incorporation of an amorphous type carbon, which may or may not be bound to the network or dispersed in the pore system, or combinations thereof. The amorphous type carbon may or may not be homogeneously distributed within the film. It is hypothesized that the higher carbon content of the ultra low k (ULK) film will decrease the depth of damage that occurs during patterning steps, and provide a solution that is more readily integrated at smaller pattern dimensions.

Described herein is a class of porogen precursors that provide higher carbon incorporation into the porous low k film, but are inherently stable. For example, refractive index remains unchanged for up to 6 months, indicating no significant bulk adsorption of water or species degradation. It has been found that certain aromatic porogen precursors for low k dielectric films that may provide increased carbon content and therefore integration attributes. In one particular embodiment, these precursors are preferably coupled with DEMS as a structure former. Other silicon containing precursors can be selected from the formulas:

(i) $R^1_n(OR^2)_p(O(O)CR^4)_{3-n-p}S^1$—$R^7$—$SiR^3_m(O(O)CR^5)_q(OR^6)_{3-m-q}$ where $R^1$ and $R^3$ are independently selected from the group consisting of H or $C_1$ to $C_4$ linear hydrocarbon, $C_3$ to $C_4$ branched, saturated, $C_2$ to $C_4$ singly unsaturated hydrocarbon, $C_3$ to $C_4$ multiply unsaturated hydrocarbon, $C_4$ cyclic hydrocarbon, $C_1$ to $C_4$ partially or fully fluorinated hydrocarbon; $R^2$, $R^6$ and $R^7$ are independently selected from the group consisting of $C_1$ to $C_6$ linear hydrocarbon, $C_3$ to $C_6$ branched, saturated or multiply unsaturated hydrocarbon, $C_2$ to $C_6$ singularly unsaturated hydrocarbon, $C_4$ to $C_6$ cyclic or, aromatic hydrocarbon, $C_1$ to $C_6$ partially or fully fluorinated hydrocarbon; $R^4$ and $R^5$ are independently selected from the group consisting of: H, $C_1$ to $C_6$ linear hydrocarbon, $C_3$ to $C_6$ branched, saturated or multiply unsaturated hydrocarbon, $C_2$ to $C_6$ singularly unsaturated hydrocarbon, $C_4$ to $C_6$ cyclic or, aromatic hydrocarbon, $C_1$ to $C_6$ partially or fully fluorinated hydrocarbon; n is 0 to 3; m is 0 to 3; q is 0 to 3 and p is 0 to 3; provided that n+m≥1, n+p≤3, and m+q≤3;

(ii) $R^1_n(OR^2)_p(O(O)CR^3)_{4-(n+p)}Si$ where $R^1$ is independently selected from the group consisting of: H or $C_1$ to $C_4$ linear hydrocarbon, $C_3$ to $C_4$ branched, saturated, or multiply unsaturated, $C_2$ to $C_4$ singularly unsaturated hydrocarbon, $C_4$ cyclic hydrocarbon, $C_1$ to $C_4$ partially or fully fluorinated hydrocarbon; $R^2$ is independently selected from the group consisting of $C_1$ to $C_6$ linear hydrocarbon, $C_3$ to $C_6$ branched, saturated, singly or multiply unsaturated hydrocarbon, $C_2$ to $C_6$ singularly unsaturated hydrocarbon, $C_4$ to $C_6$ cyclic or aromatic hydrocarbon, $C_1$ to $C_6$ partially or fully fluorinated hydrocarbon, $R^3$ is independently selected from the group consisting of H, $C_1$ to $C_6$ linear hydrocarbon, $C_3$ to $C_6$ branched, saturated, or multiply unsaturated, $C_2$ to $C_4$ singularly unsaturated hydrocarbon, $C_4$ to $C_6$ cyclic or aromatic hydrocarbon, $C_1$ to $C_6$ partially or fully fluorinated hydrocarbon; n is 1 to 3; and, p is 0 to 3;

(iii) Methyltriethoxysilane; and, (iv) Methyltrimethoxysilane.

In certain embodiments, the one or more silicon containing precursor is stabilized by adding one or more stabilizers described herein. In other embodiments, the one or more silicon containing precursor is not stabilized by adding one or more stabilizers described herein.

The porogen precursor is aromatic in nature, and represented by the formula:

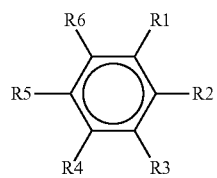

where R1-R6 are groups that can be independently selected from the group consisting of: H; or OH; or $C_1$ to $C_6$ linear hydrocarbon, or $C_3$ to $C_6$ branched, saturated, or multiply unsaturated hydrocarbon, $C_2$ to $C_6$ singularly unsaturated hydrocarbon, $C_4$ to $C_6$ cyclic hydrocarbon; or $C_1$ to $C_6$ linear alcohol, $C_3$ to $C_6$ branched, saturated or multiple unsaturated, alcohol or cyclic ether, and $C_2$ to $C_6$ epoxide or ketone.

Preferably, the aromatic porogen precursor is selected from the group consisting of: toluene, benzene, cymene, xylene, phenol, mesitylene, ethyl benzene, styrene, ethoxybenzene, methoxybenzene, benzaldehyde and mixtures thereof. More preferably the porogen precursor is cymene or toluene. In certain embodiments, the porogen precursor is stabilized by the addition of one or more stabilizers described herein. In other embodiments, the porogen precursor is not stabilized by one or more stabilizers described herein.

The silicon containing precursor can include a mixture of two or more different silicon containing precursors, such a mixture of two or more of: diethoxymethylsilane (DEMS), tetraethylorthosilicate (TEOS), triethoxysilane (TES) and diethoxysilane (DES) or any silicon precursor meeting the formula: $R^1_x R^2_y Si$ is added to the deposition process, where $R^1$ and $R^2$ can be independently alkoxy or hydrogen groups, and x+y=4.

Although the phrase "gaseous reagents" is sometimes used herein to describe the precursors described herein, the phrase is intended to encompass precrusros delivered directly as a gas to the reactor or reaction chamber, delivered as a vaporized liquid, a sublimed solid and/or transported by an inert carrier gas into the reactor or reaction chamber.

In addition, the precursors or mixtures thereof can be carried into the reactor separately from distinct sources or as a mixture, or as a combination of these means. The reagents can be delivered to the reactor system by any number of means, preferably using a pressurizable stainless steel vessel fitted with the proper valves and fittings to allow the delivery of liquid to the process reactor or reaction chamber.

The porogen phase after deposition may or may not be in the same form as the porogen introduced into the reaction chamber. As well, the porogen removal process may liberate the porogen or fragments thereof from the film. In essence, the porogen reagent, the porogen in the composite film, and the porogen being eliminated may or may not the be same species. Regardless of whether or not the porogen is unchanged throughout the intentive process, the term "porogen" as used herein is intended to encompass pore-forming reagents and derivations thereof, in whatever form they are found throughout the entire process of the invention.

In addition to structure forming species and pore-forming species, additional materials can be charged into the vacuum chamber prior to, during and/or after the deposition process. Such materials include, e.g. inert gases such as He, Ar, $N_2$, Kr, Xe, etc, which may be employed as a carrier gas for less volatile materials and/or which can promote the curing of the composite material and provide a more stable final film. Such materials can also include reactive species such as $NH_3$, $H_2$, $CO_2$, or CO.

Energy is applied to the gaseous reagents to induce the gases to react and form a film on the substrate. Such energy can be provided by thermal, plasma, pulsed plasma, helicon plasma, high density plasma, inductively coupled plasma, and remote plasma. A secondary frequency source can be used to modify the plasma characteristics at the substrate surface.

The flow rate of each of the gaseous reagents preferably ranges from 5 to 5000 sccm, more preferably from 10 to 1000 sccm per single 200 mm wafer. The individual rates are selected so as to provide the desired amounts of structure-former and pore-structure in the film. The actual flow rates needed may depend on wafer size, chamber configuration, and in no way is limited to 200 mm single wafer chambers.

It is preferred that the film deposite at a rate of at least 50 nm/min.

The pressure in the deposition chamber may be between 0.01 to 600 torr, more preferably 1 to 15 torr.

The temperature in the deposition chamber may be between 50 to 500° C., more preferably 200-400° C.

After deposition, the organosilicate composite film is exposed to one or more ultra-violet radiation sources, with at least a portion of output ranging from 200-400 nm. The composite film may be exposed to one or more wavelength in the vacuum UV range (less than 200 nm). The UV source may be continuous, pulsed, rastered, focused, dispersive, shuttered, or sweeping. The UV source may be an excimer laser, a barrier discharge lamp, a mercury lamp, a microwave generated UV lamp, or a laser. It may be placed at a distance of 50 millimeters to 1000 feet from the substrate.

In certain embodiments, the UV exposure step is performed in a non-oxidizing atmosphere, an inert atmosphere, or a reducing atmosphere.

The temperature in the UV chamber may be between 50 to 500° C., more preferably 250-450° C. The pressure in the UV chamber may be between 100 millitorr to 1000 torr.

EXAMPLES

All experiments were performed on an Applied Materials Precision-5000 system in a 200 mm DXZ chamber fitted with Advance Energy 2000 rf generator, using an undoped TEOS process kit. The recipe involved basic steps: initial step up and stabilization of gas flows, deposition, and purge/evacuation of chamber prior to wafer removal. Composite films were exposed to UV radiation using a Fusion H+ bulb under inert atmosphere with temperature controlled to 450° C. or less. UV exposure times are optimized to balance dielectric constant and mechanical properties.

Example 1

Figure 2:
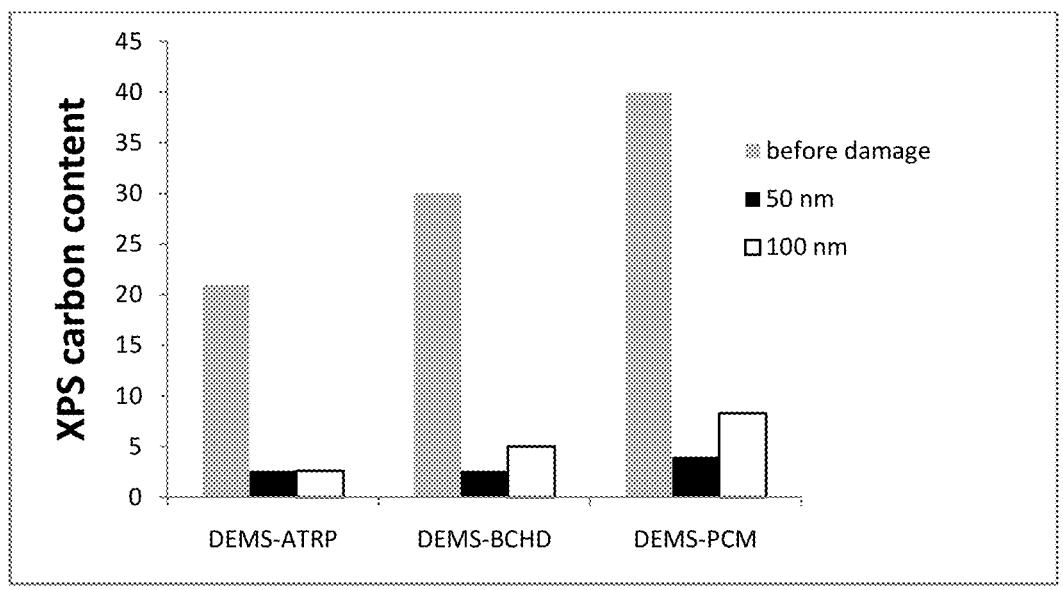
FIG. 2. XPS carbon content of k=2.3 porous films before plasma damage and after plasma damage. A highly aggressive remote oxygen exposure was utitilized to simulate oxidative ash damage. DEMS-PCM films result in higher remaining carbon content afer damage, which is indicative of enhanced integration damage resistance FIGS. 3 A & B. Modulus (FIG. 3A) and dielectric constant (FIG. 3B) of DEMS-PCM film as a function of ultraviolet (UV) cure time. Modulus can be greatly enhanced without substantial increase in dielectric constant. A high carbon content of 30% carbon by XPS is retained after 30 minutes of UV exposure FIG. 4. Hydrocarbon signal from FT-IR for DEMS-Paracymene films after various post-treatments using a deposition recipe targeting a final dielectric of k=2.2. Film data after post treatment is listed in table 5.

In Table 1, it is shown that for deposition processing conditions between 275-300° C., and standard UV cure times, DEMS-PCM desposit a substantial amount of carbon, as shown in FIG. 1 and FIG. 2, but the type of carbon is far more durable to post treatment, such as U.V. exposure than the types of carbon deposited by other porogens, such as ATRP and BCHD. Table 2 shows a similar correlation, as that of Table 1, for the surprising advantage of PCM, in contrast to ATRP, in imparting more carbon and a type of carbon which is more durable under U.V. exposure and more effective at enhancing or retaining modulus in the deposited films. As stated above, PCM provides surprisingly higher modulus despite higher carbon content, but the last run reported in Table 2 shows that even with relatively less carbon, PCM can provide higher modulus, indicating that the type of carbon deposited by PCM is different than the carbon deposited by other porogens. This type of carbon is believed to be amorphous carbon devoid of any substantial hydrogen and not appreciably involved in the silicon-oxygen cage structure of the $SiO_2$ deposited film.

TABLE 1

|  | DEMS/ATRP | DEMS/BCHD | DEMS/PCM | DEMS/PCM | DEMS/TOLUENE |
| --- | --- | --- | --- | --- | --- |
| Power (Watts) | 600 | 500 | 650 | 650 | 650 |
| Temp (C.) | 300 | 275 | 275 | 275 | 300 |
| DEMS flow (mg/min) | 144 | 300 | 225 | 225 | 200 |
| Porogen flow (mg/min) | 620 | 300 | 675 | 675 | 800 |
| UV Cure Time | standard | standard | standard | 2.3 × standard | standard |
| Dielectric Constant | 2.3 | 2.3 | 2.3 | 2.3 | 2.3 |
| Modulus (Gpa) | 4.2 | 3.0 | 3.0 | 5.0 | 3.0 |
| XPS Carbon | 21% | 29% | 34% | 31% | 36% |
| XPS Oxygen | 46% | 41% | 34% | 38% | 33% |
| XPS Silicon | 33% | 30% | 32% | 31% | 31% | films of dielectric constant k=2.3 can be achieved using the porogens alpha terpinene (ATRP), bicycloheptadiene (BCHD), para-cymene (PCM), or toluene in combination with the silicon-containing precursor, DEMS. When PCM or toluene are used, the carbon content by XPS is more than 50% increased compared to the DEMS-ATRP baseline. When an extended UV cure time is used, mechanical properties superior to the DEMS-ATRP baseline can be achieved with DEMS-PCM, while maintaining higher total carbon content. What is surprising in Table 1 with regard to DEMS-PCM versus the other porogens is that the high carbon content is achieved without a significant loss of modulus. In the prior art, the primary influence on total carbon content is the silicon-methyl functionality in the silicon backbone. However, increasing this silicon methyl functionality results in lower mechanical properties due to the decrease in network bond density. In contrast, the DEMS-PCM process provides carbon incorporation that is not inherently detrimental to the mechanical properties of the film.-. DEMS-PCM provides the unexpected result of high carbon content with relatively high or tunable modulus, unlike the prior art. It has also been shown that DEMS-PCM deposits carbon that is much less susceptible to removal by UV treatment. The second run of DEMS-PCM in Table 1 used a 2.3× U.V. exposure, over that of the other reported runs, yet still resulted in a 31% carbon content by XPS analysis. This indicates that not only does Example 2

In Table 2, it is shown that for deposition processing conditions between 300-315° C., films of dielectric constant k=2.5 can be achieved using the porogens alpha terpinene (ATRP), or para-cymene (PCM) in combination with the silicon-containing precursor, DEMS. When PCM is used, the carbon content is more than 50% increased compared to the DEMS-ATRP baseline. When an extended UV cure time is used, mechanical properties well above 5 GPa by nanoindentation can be achieved with DEMS-PCM while maintaining higher total carbon content. Thus, for a given carbon content, PCM is able to achieve a higher modulus than ATRP and other porogens; and conversely, for a given modulus, PCM can provide a higher carbon content.

The surprising value of this data is that prior to experimentation and analysis of DEMS-PCM films, those of ordinary skill in the art assumed that there was a trade-off between carbon content and modulus where one could not have a film with both high modulus and high carbon content. Thus, PCM provides two levels of better process optimization of a porous low-k film: higher modulus, meaning a more robust film and higher relative carbon content for a given modulus, meaning a more etch resistant film better capable of process integration, such as in patterning the dielectric DEMS-PCM deposited film for electronic device creation or copper line patterning for conductors.

Figure 6:
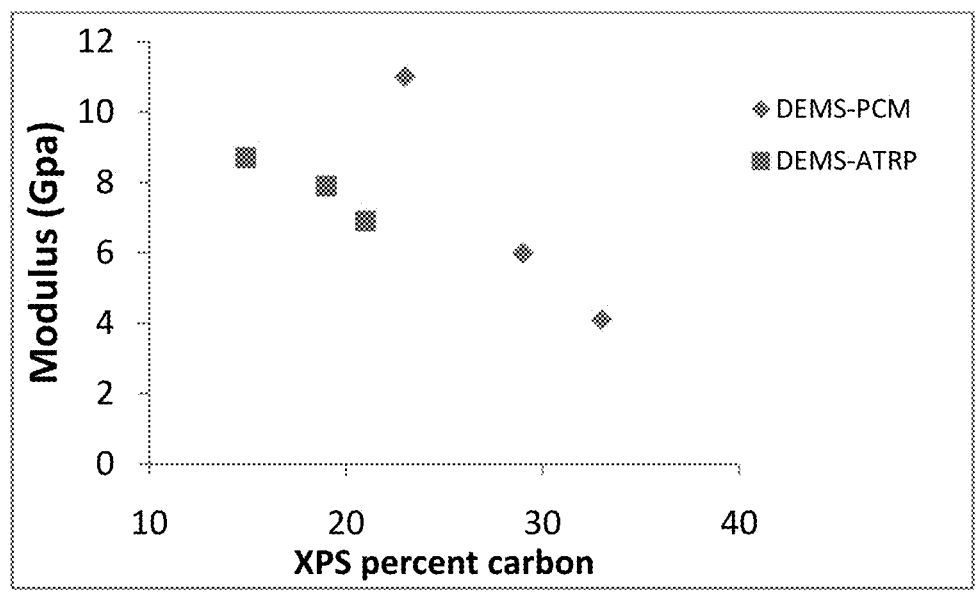
FIG. 6. Modulus by nanoindentation versus XPS percent carbon concentration for k=2.5 dielectric films deposited from DEMS-ATRP and DEMS-PCM.

This is illustrated graphically, in FIG. 6, where for levels of carbon less than approximately 35% XPS, DEMS-PCM uniformly achieves higher modulus with higher carbon than DEMS-ATRP.

TABLE 2

|  | DEMS/ATRP | DEMS/ATRP | DEMS/ATRP | DEMS/PCM | DEMS/PCM | DEMS/PCM |
| --- | --- | --- | --- | --- | --- | --- |
| Power (Watts) | 750 | 750 | 750 | 650 | 650 | 650 |
| Temp (C.) | 300 | 300 | 300 | 315 | 315 | 315 |
| DEMS flow (mg/min) | 275 | 275 | 320 | 250 | 250 | 250 |
| Porogen flow (mg/min) | 825 | 825 | 745 | 750 | 750 | 750 |
| UV Cure Time | 1.4x Standard 400 C. | Standard 400 C. | Standard 400 C. | Standard 400 C. | 2.5 x standard 400 C. | 1.8X standard 420 C. |
| Dielectric Constant | 2.5 | 2.5 | 2.5 | 2.5 | 2.5 | 2.5 |
| Modulus (Gpa) | 8.8 | 6.9 | 7.9 | 4.1 | 6.0 | 11.0 |
| XPS Carbon | 15% | 21% | 19% | 33% | 29% | 23% |
| XPS Oxygen | 52% | 44% | 47% | 37% | 40% | 45% |
| XPS Silicon | 33% | 33% | 34% | 30% | 31% | 32% |

FIG. 1 further demonstrates the carbon content range that is available when depositing films using DEMS and para-cymene. The process conditions used were 225-300° C., 500-800 Watts, 500-1100 mg/min total liquid flow, and 60-85% porogen precursor. For DEMS and ATRP, there is a fairly linear relationship between total carbon content and dielectric constant. However, for DEMS and para-cymene, the processing conditions that are used can greatly increase total carbon content, and thus, providing the option for greater integration damage optimization.

Example 3

After deposition and UV exposure, films were exposed to an oxygen plasma to simulate integration damage.

FIG. 2 demonstrates the film properties obtained using para-cymene as the porogen precursor. The deposition conditions were selected for this film in order to provide a high XPS carbon content before damage exposure. In this experiment, a remote oxygen plasma was used to damage the surface of a blanket dielectric film. It is expected that the remote oxygen plasma will be more aggressive than a typical etch process, and therefore the experiment represents a worst-case scenario. The carbon depletion was monitored using XPS after sputtering. It can be seen that a higher carbon content is retained for the para-cymene film compared to BCHD or ATRP. By using three XPS sputtering depths: before damage, at 50 nm and at 100 nm, it can be observed that the carbon loss for the DEMS-paracymene films at 50 nm and particularly at 100 nm is less than the comparative examples, resulting in a lower depth of damage which is preferential for patterning of features where depth of sidewall damage has a strong impact on cd control.

Example 4

After deposition, composite DEMS-paracymene films were treated with UV light for multiple exposure times.

Figure 3:
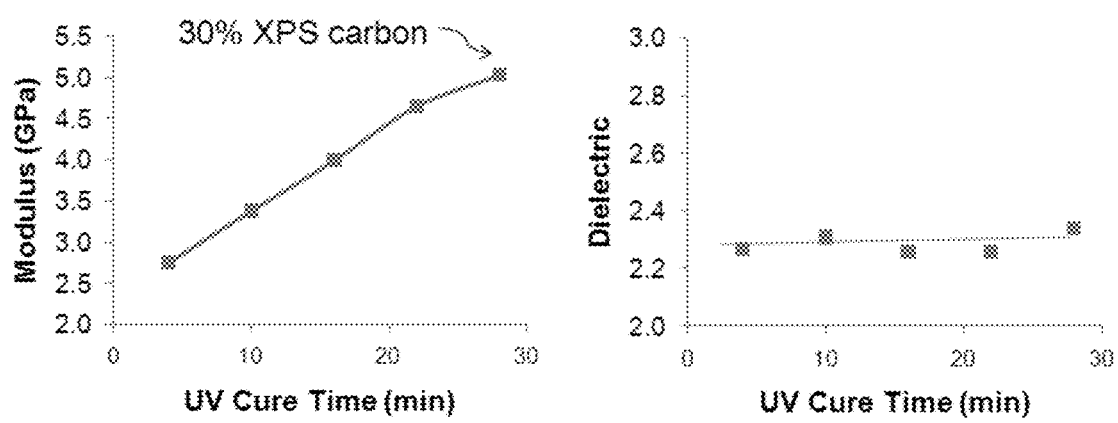

A high total carbon content and high modulus can be obtained by optimizing the UV cure time, that is utilized in post-treating the low k film. As illustrated in FIG. 3, modulus enhancement is observed by extending the total UV cure time (FIG. 3A), without significant impact to dielectric constant (FIG. 3B), and with retention of up to 30% carbon, as determined by XPS analysis.

Example 4

If an oxidizing gas is used, it may be preferable to limit the flow of the oxidizing species to <50% compared to the total liquid precursor vapor flow, or more preferably to less than 20% compared to the total liquid precursor vapor flow, by volume in standard cubic centimeters per minute (sccm). See Table 3. Preferred oxidants include: oxygen, hydrogen peroxide, ozone and dinitrogen oxide. Not wishing to be bound by theory, it is hypothesized that an oxidizing gas flow of >50% of the total liquid precursor vapor flow can result in inferior film mechanical properties.

TABLE 3

|  | DEMS flow (sccm) | Porogen flow (sccm) | Oxygen flow (sccm) |
| --- | --- | --- | --- |
| Example of preferred embodiment | 38 sccm (225 mg/min) | 110 sccm (675 mg/min) | 70 sccm |
| More preferred embodiment | 38 sccm (225 mg/min) | 110 sccm (225 mg/min) | 10 sccm |

Example 5

Composite films treated with a) UV and b) thermal exposures were compared.

Figure 4:
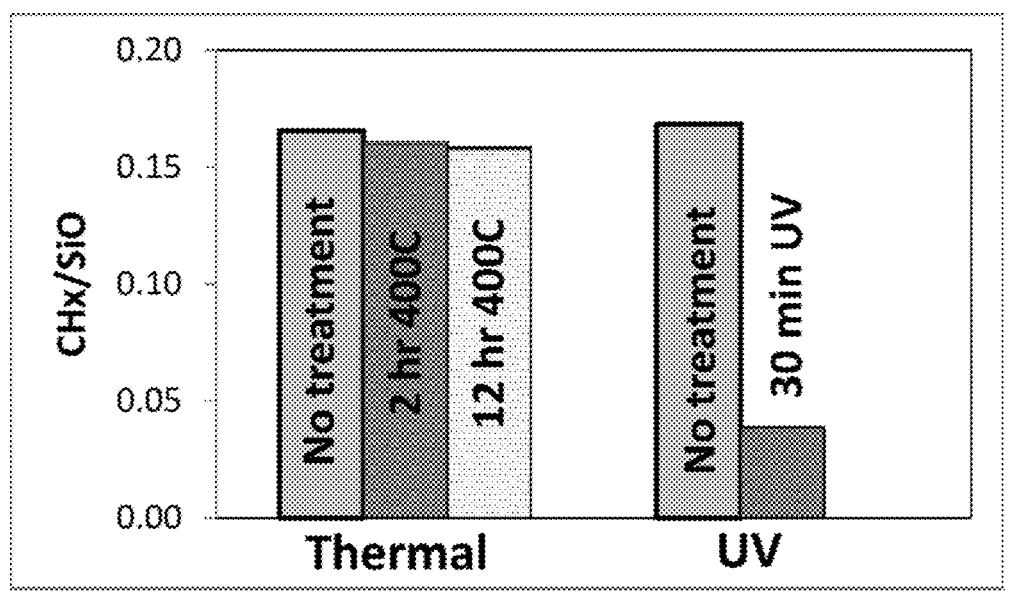

Here, we show the distinct benefit of using aromatic porogen precursors such as para-cymene in combination with UV post treatment. In FIG. 4, the $CH_x/SiO$ peak area ratio from FT-IR is plotted, while in FIG. 5 the FT-IR spectrum and peak assignments are shown. This $CH_x$ FT-IR signal at ~2800-3000 wavenumbers includes a majority contribution from the organic porogen present in the composite film before post treatment. As shown in the two figures, there is minimal $CH_x$ peak decrease and therefore porogen removal from DEMS-paracymene films when using thermal treatment at 400 C. under vacuum, even when extending the treatment to 12 hours. In contrast, 30 minutes of UV exposure removes a substantial amount of the porogen from the film. The benefit of the UV treatment is also observed in Table 4, where dielectric constants measured by mercury probe are listed. The ability of the UV treatment to remove porogen species from the composite film results in a dielectric constant of 2.27, compared to >2.8 for thermal treatment at 400° C. Similar trends are observed for recipe 2, which targets a k=2.5 film as the final result. In this case, the UV post-treatment is also more effective in removing porogen from the composite film.

TABLE 4

| Post-treatment | Dielectric constant |
| --- | --- |
| DEMS-PCM films deposited by PECVD Recipe 1 targeting k = 2.3 film | |
| 2 hours 400° C. | 2.88 |
| 12 hours 400° C. | 2.83 |
| 30 minutes UV | 2.27 |
| DEMS-PCM films deposited by PECVD Recipe 2 targeting k = 2.5 film | |
| 2 hours 400° C. | 2.80 |
| 12 hours 400° C. | 2.84 |
| 30 min UV | 2.46 |

In addition, the use of UV curing provides mechanical property benefits when compared to thermal treatment, as shown in Table 5. The combination of an aromatic porogen (p-cymene), a organosilicon film backbone, and UV post treatment enables a low dielectric constant film with higher carbon content and sufficient mechanical properties compared to other precursor options.

TABLE 5

| Post treatment | Modulus - Best results | Dielectric constant |
| --- | --- | --- |
| Thermal | 7.7 | 2.8 |
| UV | 11.0 | 2.5 |

Figure 5:
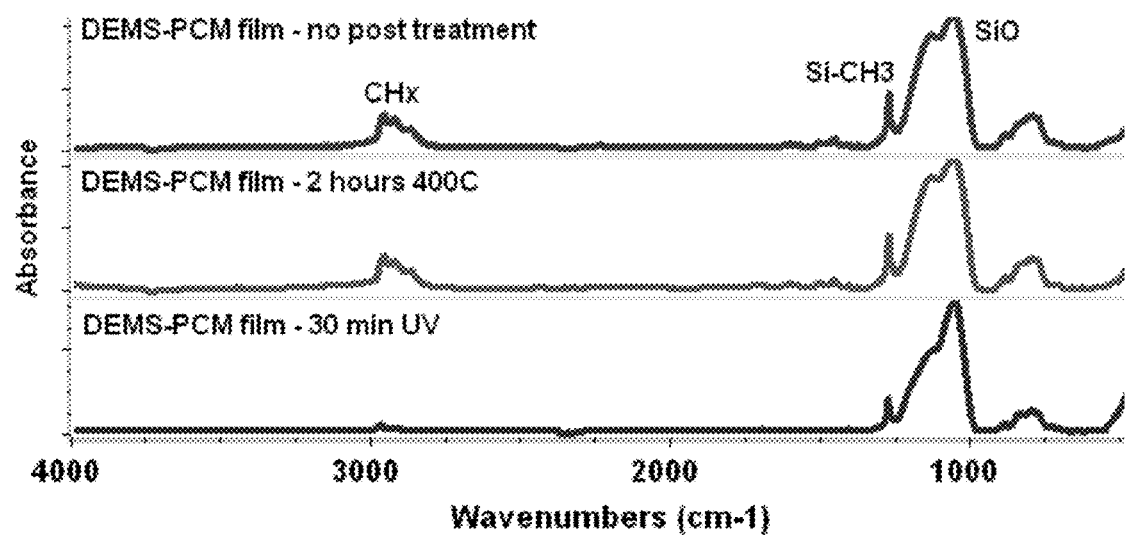
FIG. 5. FT-IR spectrum of DEMS-PCM films as a function of post treatment. Si—O, Si—CH$_3$, and CH$_x$ peaks are labeled.

The benefits of UV exposure to porous SiCOH films has been disclosed in the prior art for precursors such as DEMS-ATRP. The UV process is proposed to strengthen the organosilicon backbone through at least two mechanisms. The first is conversion of cage like broad angle Si—O bonding to tetrahedral. This is observed as a decrease in FT-IR peak area around 1150 wavenumbers, as evidenced in FIG. 5. It can be observed in FIG. 5 that minimal change has occurred in the Si—O bonding region as a result of the thermal treatment, while substantial decrease in the ~1150 wavenumber peak is observed for UV post treatment. This is consistent with superior mechanical properties. A second potential mechanism is the loss of silicon-methyl backbone bonding with UV exposure. This is observed as a decrease in the FT-IR ~1280 peak, as shown in FIG. 5. As terminal methyl bonds are lost, there is greater network connectivity achieved in the backbone, resulting in superior mechanical properties. The UV exposure is optimized so that the final silicon-methyl backbone content is such that the film remains hydrophobic with a water contact angle for example of 80-90 degrees. See also U.S. Pat. No. 7,098,149.

Although mechanical properties can be improved by the removal of silicon-methyl backbone bonding, this traditionally also results in a lower total carbon content and therefore challenging integration; i.e., film stability during pattern etching, etc. The reduction of film carbon content can then cause sidewall damage during patterning with standard techniques. Therefore, it is enabling to the industry to provide a porous film that has similar mechanical properties; i.e., modulus, to industry baselines, but can provide higher total carbon content; i.e., etch resistance.

The unique film composition provided by DEMS-paracymene deposition coupled with UV post treatment meets this need. The amorphous-type carbon provided during deposition by DEMS-PCM is believed to be unaffected by UV post treatment. Therefore significantly more carbon is retained in the final film when using paracymene, per FIGS. 1 and 2 than ATRP or BCHD, even though silicon-methyl backbone species have been reduced, although relatively less, during UV exposure. This amorphous carbon is essentially not $CH_x$ hydrocarbon and is essentially not silicon-methyl backbone species. The amorphous carbon has no substantial response in the FT-IR spectra of FIG. 5, but is observable via XPS analysis as part of the total carbon signal from the film (FIGS. 1 and 2).

Example 6

The prior art presents formation of high carbon content SiCOH films through formation of a three phase composite, where the first phase is an SiCOH network, the second phase is a hydrogen containing carbon phase $CH_x$, and the third phase is porosity. The hydrogen containing $CH_x$ phase in these films is clearly evident through FT-IR analysis of the hydrocarbon peak at ~3000 wavenumbers. In the prior art, this hydrocarbon peak is 20 times greater for the three phase film compared to a single phase film. The peak at ~3000 wavenumbers reflects the signal from the C—H stretching in the silicon-methyl backbone functionality in addition to any organic hydrogen containing $CH_x$ present in the film due to porogen. In the single phase film, there is no organic source (porogen) in the deposition, thus the C—$H_x$ stretching FT-IR peak reflects only the contribution from the silicon-methyl backbone. An FT-IR for a film of the present invention is shown in FIG. 5, labeled "DEMS-PCM film 30 min UV", with peak areas tabulated in Table 6 relative to comparative data. It can be seen that the C—$H_x$ peak area value for the DEMS-paracymene film is within the range observed for single phase SiCOH films; with essentially insubstantial detectable levels of a hydrogen containing $CH_x$ third phase. Unlike films disclosed in the prior art, these DEMS-paracymene films do not appear to contain a hydrogen rich third organic phase. See also Grill, U.S. Pat. No. 6,312,793.

TABLE 6

| | $CH_x$/SiO FT-IR signal | Contributions to $CH_x$ peak in FT-IR |
| --- | --- | --- |
| Prior Art single phase SiCOH film | 0.02 | Silicon-methyl backbone |
| Prior Art multi phase SiCOH film | 0.40 | $CH_x$ third phase + silicon-methyl backbone |
| APCI single phase SiCOH film | 0.02-0.03 | Silicon-methyl backbone |
| APCI DEMS-paracymene porous film | 0.01-0.03 | Silicon-methyl backbone |
| Amorphous carbon | 0 | No signal expected |

Not wishing to be bound by theory, the higher total carbon content (for example as determined by XPS, FIGS. 1 and 2) in DEMS-paracymene films compared to films formed from other precursors is believed to be due to the presence of amorphous elemental carbon (essentially inorganic carbon), which is largely FT-IR transparent and non-hydrogen containing (see Table 6).

The invention claimed is:

1. A chemical vapor deposition method for producing a porous organosilica glass film, said method comprising:
   providing a substrate within a vacuum chamber;
   introducing into the vacuum chamber, gaseous reagents including at least one precursor selected from the group consisting of one or more silicon-containing precursor; and a porogen precursor, that is distinct from the silicon-containing precursor;

wherein the porogen precursor is aromatic in nature, and represented by the formula:

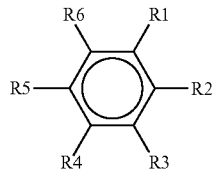

where R1-R6 are independently selected from the group consisting of: H, OH, $C_1$ to $C_6$ linear hydrocarbon, $C_3$ to $C_6$ branched, saturated, singly or multiply unsaturated hydrocarbon, $C_4$ to $C_6$ cyclic hydrocarbon, $C_1$ to $C_6$ alcohol, $C_4$ to $C_6$ branched, saturated or multiple unsaturated, cyclic ether, $C_2$ to $C_6$ epoxide or ketone;

wherein the one or more silicon containing precursors are selected from the formulas:

(i) $R^1_n(OR^2)_p(O(O)CR^4)_{3-n-p}Si-R^7-SiR^3_m(O(O)CR^5)_q(OR^6)_{3-m-q}$ where $R^1$ and $R^3$ are independently selected from the group consisting of H or $C_1$ to $C_4$ linear hydrocarbon, $C_3$ to $C_4$ branched or saturated hydrocarbon, $C_2$ to $C_4$ singly unsaturated hydrocarbon, $C_3$ to $C_4$ multiply unsaturated hydrocarbon, $C_4$ cyclic hydrocarbon, $C_1$ to $C_4$ partially or fully fluorinated hydrocarbon; $R^2$, $R^6$ and $R^7$ are independently selected from the group consisting of $C_1$ to $C_6$ linear hydrocarbon, $C_3$ to $C_6$ branched, saturated or multiply unsaturated hydrocarbon, $C_2$ to $C_6$ singularly unsaturated hydrocarbon, $C_4$ to $C_6$ cyclic or, aromatic hydrocarbon, $C_1$ to $C_6$ partially or fully fluorinated hydrocarbon; $R^4$ and $R^5$ are independently selected from the group consisting of: H, $C_1$ to $C_6$ linear hydrocarbon, $C_3$ to $C_6$ branched, saturated or multiply unsaturated hydrocarbon, $C_2$ to $C_6$ singularly unsaturated hydrocarbon, $C_4$ to $C_6$ cyclic or, aromatic hydrocarbon, $C_1$ to $C_6$ partially or fully fluorinated hydrocarbon; n is 0 to 3; m is 0 to 3; q is 0 to 3 and p is 0 to 3; provided that n+m≥1, n+p≤3, and m+q≤3;

(ii) $R^1_n(OR^2)_p(O(O)CR^3)_{4-(n+p)}Si$ where $R^1$ is independently selected from the group consisting of: H or $C_1$ to $C_4$ linear hydrocarbon, $C_3$ to $C_4$ branched, saturated, or multiply unsaturated hydrocarbon, $C_2$ to $C_4$ singularly unsaturated hydrocarbon, $C_4$ cyclic hydrocarbon, $C_1$ to $C_4$ partially or fully fluorinated hydrocarbon; $R^2$ is independently selected from the group consisting of $C_1$ to $C_6$ linear hydrocarbon, $C_3$ to $C_6$ branched, saturated, singly or multiply unsaturated hydrocarbon, $C_2$ to $C_6$ singularly unsaturated hydrocarbon, $C_4$ to $C_6$ cyclic or aromatic hydrocarbon, $C_1$ to $C_6$ partially or fully fluorinated hydrocarbon, $R^3$ is independently selected from the group consisting of H, $C_1$ to $C_6$ linear hydrocarbon, $C_3$ to $C_6$ branched, saturated, or multiply unsaturated hydrocarbon, $C_2$ to $C_4$ singularly unsaturated hydrocarbon, $C_4$ to $C_6$ cyclic or aromatic hydrocarbon, $C_1$ to $C_6$ partially or fully fluorinated hydrocarbon; n is 1 to 3; and, p is 0 to 3;

(iii) Methyltriethoxysilane; and, (iv) Methyltrimethoxysilane;

applying energy to the gaseous reagents in the vacuum chamber to induce reaction of the gaseous reagents to deposit a preliminary film on the substrate, wherein the preliminary film contains the porogen; and using UV radiation to remove from the preliminary film a portion of organic material originating from the porogen precursor to provide the porous organosilica glass film having a dielectric constant of from 2.1 to 2.6 and a carbon content (XPS) of from 33% to 45%.

2. The method of claim 1 wherein the porous organosilica glass film is represented by the formula $Si_vO_wC_xH_yF_z$, where v+w+x+y+z=100%, v is from 10 to 35 atomic %, w is from 10 to 65 atomic %, y is from 10 to 50 atomic % and z is from 0 to 15 atomic %.

3. The method of claim 2 wherein w is from 20 to 45 atomic %, and z is 0.

4. The method of claim 1 wherein an oxidant is added.

5. The method of claim 4 wherein the oxidant is selected from the group consisting of $O_2$, ozone, $H_2O_2$, and $N_2O$.

6. The method of claim 4 wherein the ratio of added oxidant is <50% compared to the total precursor vapor flow.

7. The method of claim 4 wherein the ratio of added oxidant is <20% compared to the total precursor vapor flow.

8. The method of claim 1 wherein the method takes place in the absence of added oxidant.

9. The method of claim 1 wherein a silicon precursor having formula $R^1_xR^2_ySi$ is added to the deposition method, where $R^1$ and $R^2$ can be independently alkoxy or hydrogen groups, and x+y=4.

10. The method of claim 1 wherein TEOS is added to the deposition method.

11. The method of claim 1 wherein TES (triethoxysilane) is added to the deposition method.

12. The method of claim 1 wherein DES (diethoxysilane) is added to the deposition method.

13. The method of claim 1 wherein most of the hydrogen in the porous organosilica glass film is bonded to carbon.

14. The method of claim 1 wherein the porous organosilica glass film has a density less than 1.5 g/ml.

15. The method of claim 1 wherein the porous organosilica glass film has pores which have an equivalent spherical diameter less than or equal to 5 nm.

16. The method of claim 1 wherein the porous organosilica glass film has an average weight loss of less than 1.0 wt %/hr isothermal at 425° C. under $N_2$.

17. The method of claim 1 wherein the porous organosilica glass film has an average weight loss of less than 1.0 wt %/hr isothermal at 425° C. under air.

18. The method of claim 1 wherein the porogen is selected from the group consisting of: toluene, benzene, cymene, xylene, phenol, mesitylene, ethyl benzene, styrene, ethoxybenzene, methoxybenzene, benzaldehyde and mixtures thereof.

19. The method of claim 1 wherein the porogen is cymene.

20. The method of claim 1 wherein the porogen is toluene.

21. The method of claim 1, wherein the silicon-containing precursor is diethoxymethylsilane (DEMS).

* * * * *